(12) United States Patent
Mizukami et al.

(10) Patent No.: US 8,727,505 B2
(45) Date of Patent: May 20, 2014

(54) ELECTROMECHANICAL TRANSDUCER ELEMENT, DROPLET DISCHARGE HEAD, AND DROPLET DISCHARGE DEVICE

(75) Inventors: Satoshi Mizukami, Kanagawa (JP); Yoshikazu Akiyama, Kanagawa (JP); Masaru Shinkai, Kanagawa (JP); Keiji Ueda, Kanagawa (JP); Kanshi Abe, Kanagawa (JP); Takakazu Kihira, Kanagawa (JP); Naoya Kondo, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/529,304

(22) Filed: Jun. 21, 2012

(65) Prior Publication Data

US 2013/0002767 A1  Jan. 3, 2013

(30) Foreign Application Priority Data

Jun. 30, 2011  (JP) .................................. 2011-145554

(51) Int. Cl.
  *B41J 2/045* (2006.01)
(52) U.S. Cl.
  USPC .................. 347/68; 347/71; 347/72; 310/358; 252/62.9 PZ
(58) Field of Classification Search
  USPC .......................... 347/68, 71, 72; 310/358, 311; 252/62.9 PZ
  See application file for complete search history.

(56) References Cited

U.S. PATENT DOCUMENTS

| | | |
|---|---|---|
| 6,350,644 B1 | 2/2002 | Sakurai |
| 6,551,652 B2 | 4/2003 | Qiu et al. |
| 7,328,490 B2 | 2/2008 | Murai et al. |
| 2008/0233277 A1 | 9/2008 | Kubota et al. |

FOREIGN PATENT DOCUMENTS

| | | |
|---|---|---|
| JP | 8-186182 | 7/1996 |
| JP | 3202006 | 6/2001 |
| JP | 2001-244516 | 9/2001 |
| JP | 2002-43641 | 2/2002 |
| JP | 3341357 | 8/2002 |
| JP | 3482883 | 10/2003 |
| JP | 2004-268414 | 9/2004 |
| JP | 3705089 | 8/2005 |
| JP | 3847689 | 9/2006 |
| JP | 3890733 | 12/2006 |
| JP | 2007-335779 | 12/2007 |
| JP | 4189504 | 9/2008 |
| JP | 4207167 | 10/2008 |
| JP | 4283036 | 3/2009 |
| JP | 2010214800 | 9/2010 |
| JP | 2012-61702 | 3/2012 |
| WO | WO2012/036103 | 3/2012 |

*Primary Examiner* — Henok Legesse
(74) *Attorney, Agent, or Firm* — Cooper & Dunham LLP

(57) ABSTRACT

Disclosed is an electromechanical transducer element that includes an electromechanical transducer film formed of a complex oxide (PZT) including lead (Pb), zirconium (Zr), and titanium (Ti). The electromechanical transducer film is formed by laminating plural PZT thin films until a thickness of the formed electromechanical transducer film becomes a predetermined thickness. When an atomic weight ratio (Pb/(Zr+Ti)) of average Pb included in the formed electromechanical transducer film is denoted by Pb(avg) and an atomic weight ratio (Pb/(Zr+Ti)) of Pb in any one of laminate interfaces of the plural PZT thin films is denoted by Pb(interface), the Pb(avg) is greater than or equal to 100 atomic percentage (at %) and less than or equal to 110 atomic percentage (at %), and a fluctuation ratio ΔPb=Pb(avg)−Pb(interface) of Pb in the laminate interface is less than or equal to 20 percent.

9 Claims, 8 Drawing Sheets

ELECTROMECHANICAL TRANSDUCER ELEMENT, DROPLET DISCHARGE HEAD, AND DROPLET DISCHARGE DEVICE

BACKGROUND OF THE INVENTION

1. Field of the Invention

Embodiments of the present invention relate to an electromechanical transducer element, a droplet discharge head including the electromechanical transducer element, and a droplet discharge device including the droplet discharge head.

2. Description of the Related Art

A droplet discharge head is utilized as a recording head of an inkjet image forming device, such as a copier, a printer, a facsimile machine, and a plotter. Here, the image forming device forms an image on a recording material. The recording material is not limited to a paper. Namely, the image forming device forms an image by applying liquid droplets onto any recording material, such as a line, a fiber, a fabric, leather, a metal, a plastic, a glass, a timber, or a ceramic. Further, forming an image means not only to add an image having a meaning, such as a character or a graphic, to a recording media, but also to add an image having no meaning, such as a pattern, to a recording media (simply to apply liquid droplets to the medium). Further, a liquid discharged as the liquid droplets is not limited to "an ink," and the liquid is not particularly limited, provided that the liquid is in a liquid phase at a time in which the liquid is discharged. Examples of the liquid include a DNA sample, a resist, and a pattern material.

As the droplet discharge head, the droplet discharge head having the following configuration has been known. Namely, the configuration includes a nozzle (discharge port) for discharging liquid droplets, a compression chamber that communicates with the nozzle, and a discharge driving unit for increasing the pressure of the liquid inside the compression chamber. In the droplet discharge head having such a configuration, the pressure of the liquid inside the compression chamber is increased by driving the discharge driving unit. The liquid droplets are discharged from the nozzle by forcing out the liquid blocking the nozzle and being in a meniscus state by the increased pressure. Several types of the discharge driving units have been known. For example, the following configuration has been known. Namely, in the configuration, a part of walls of a compression chamber is formed of an oscillation plate, and an electromechanical transducer element including an electromechanical transducer film disposed between electrodes is attached to the oscillation plate. The pressure of the liquid inside the compression chamber is increased through the oscillation plate, when a predetermined drive voltage is applied to the electromechanical transducer element, and thereby the electromechanical transducer element is deformed.

The electromechanical transducer film included in the electromechanical transducer element is formed of, for example, a complex oxide including lead, zirconia, and titanium (hereinafter, referred to as PZT), which is a ferroelectric substance having the perovskite structure. Such a ferroelectric substance having the perovskite structure has a morphotropic phase boundary (MPB). For example, in the case of $Pb(Zr_xTi_{1-x}O_3)$, the MPB exists in the vicinity of the content ratio of $x=0.52$ of Zr. When x is less then 0.52, the crystalline structure is tetragonal. On the other hand, when x is greater than 0.52, the crystalline structure is rhombohedral. In the electromechanical transducer film, the dielectric constant and the piezoelectric property become significantly larger in the vicinity of the MPB, and an excellent electromechanical transducing characteristic is obtained in the vicinity of the MPB. Therefore, the electromechanical transducer film is formed so that the content ratio of Zr is in the vicinity of the specific content ratio of Zr, which corresponds to the MPB.

As a method of producing an electromechanical transducer film formed of the PZT, the following method has been known. Namely, in the method, a PZT precursor film is formed by applying a PZT precursor solution onto an electrode using a chemical solution deposition method (CSD method), such as the sol-gel method and the MOD method, and the electromechanical transducer film of the PZT is obtained by baking and crystallizing the PZT precursor-coating film.

Patent Document 1 (Japanese Published Unexamined Application No. 2004-268414) discloses a method of laminating thin films of the PZT in which application and baking of the PZT precursor solution are repeated several times, until an electromechanical transducer film having a desired thickness is formed. In this manner, an electromechanical transducer film having a desired thickness is formed and a desired electromechanical transducing characteristic is obtained. At the same time, during the formation of the electromechanical transducer film, cracks can be prevented from occurring.

Patent Document 2 (Japanese Published Unexamined Application No. 2010-214800) discloses a method of producing an electromechanical transducer film. In the method, the following processes are repeated several times. Namely, the processes include a precursor film forming process of forming a PZT precursor film, an adjustment film forming process of forming an adjustment film that includes Ti and that adjusts composition of an electromechanical transducer film, and a baking process of collectively baking the precursor film and the adjustment film.

Patent Document 3 (Japanese Registered Patent No. 4283036) discloses a method of forming a film. In the method, a first solution and a second solution including the same types of solute components are utilized. Here, the first solution and the second solution are for forming a PZT film. In the method, the PZT film having a desired thickness is epitaxially formed on a substrate by alternately laminating a first coating film and a second coating film several times. Here, the first coating film is formed by applying the first solution, and the second coating film is formed by applying the second solution having a higher viscosity than that of the first solution. The titanium concentration in the first solution is higher than the titanium concentration in the second solution.

SUMMARY OF THE INVENTION

An objective of the embodiments are to provide an electromechanical transducer element whose characteristic does not change substantially during a continuous operation, a droplet discharge head including the electromechanical transducer element, and a droplet discharge device including the droplet discharge head.

In one aspect, there is provided an electromechanical transducer element that includes an electromechanical transducer film formed of a complex oxide (PZT) including lead (Pb), zirconium (Zr), and titanium (Ti). The electromechanical transducer film is produced by a chemical solution deposition method. The electromechanical transducer film is formed by laminating plural PZT thin films by repeatedly applying a precursor film forming process for forming a PZT precursor film and a baking process for crystallizing the PZT precursor film until a thickness of the formed electromechanical transducer film becomes a predetermined thickness. When an atomic weight ratio (Pb/(Zr+Ti)) of average Pb included in the formed electromechanical transducer film having the predetermined thickness is denoted by Pb(avg) and an atomic weight ratio (Pb/(Zr+Ti)) of Pb in any first one of laminate interfaces of the plural PZT thin films included in the formed electromechanical transducer film is denoted by Pb(interface), the Pb(avg) is greater than or equal to 100 atomic percentage and less than or equal to 110 atomic percentage, and a fluctuation ratio ΔPb=Pb(avg)−Pb(interface) of Pb in the first one of the laminate interfaces is less than or equal to 20 percent.

For a crystalline orientation of the formed electromechanical film, a first degree of a first orientation in a plane direction (111) calculated by a Lotgering method may be greater than or equal to 0.85 and a second degree of a second orientation in a plane direction (110) calculated by the Lotgering method may be less than or equal to 0.10.

The degree of orientation determined by using the Lotgering method is defined to be an orientation ratio with respect to the sum of all the peaks of corresponding orientations obtained by X-ray diffraction. Here, the sum of all the peaks of the corresponding orientations is set to be 1. Namely, the degree of orientation is the average degree of orientation obtained by the following formula, where the denominator is set to be the sum of all the peak intensities, and the numerator is set to be a peak intensity of an arbitrary orientation.

$$\rho = \Sigma I(00l)/\Sigma I(hkl)$$

In another aspect, there is provided a droplet discharge head including a nozzle that discharges droplets; a compression chamber that communicates with the nozzle; and a discharge driving unit that increases pressure of a liquid inside the compression chamber. As the discharge driving unit, a portion of walls of the compression chamber is formed of an oscillation plate, and an electromechanical transducer element is attached to the oscillation plate. The electromechanical on transducer element includes an electromechanical transducer film formed of a complex oxide (PZT) including lead (Pb), titanium (Ti), and zirconium (Zr). The electromechanical transducer film is produced by a chemical solution deposition method. The electromechanical transducer film is formed by laminating plural PZT thin films by repeatedly applying a precursor film forming process for forming a PZT precursor film and a baking process for crystallizing the PZT precursor film until a thickness of the formed electromechanical transducer film becomes a predetermined thickness. When an atomic weight ratio (Pb/(Zr+Ti)) of average Pb included in the formed electromechanical transducer film having the predetermined thickness is denoted by Pb(avg) and an atomic weight ratio (Pb/(Zr+Ti)) of Pb in any one of laminate interfaces of the plural PZT thin films included in the formed electromechanical transducer film is denoted by Pb(interface), the Pb(avg) is greater than or equal to 100 atomic percentage and less than or equal to 110 atomic percentage, and a fluctuation ratio ΔPb=Pb(avg)−Pb(interface) of Pb in the one of the laminate interfaces is less than or equal to 20 percent.

In another aspect, there is provided a on droplet discharge device that includes a droplet discharge head. The droplet discharge head includes a nozzle that discharges droplets; a compression chamber that communicates with the nozzle; and a discharge driving unit that increases pressure of a liquid inside the compression chamber. As the discharge driving unit, a portion of walls of the compression chamber is formed of an oscillation plate, and an electromechanical transducer element is attached to the oscillation plate. The electromechanical transducer element utilizes an electromechanical transducer film formed of a complex oxide (PZT) including lead (Pb), zirconium (Zr), and titanium (Ti). The electromechanical transducer film is produced by a chemical solution deposition method. The electromechanical transducer film is formed by laminating plural PZT thin films by repeatedly applying a precursor film forming process for forming a PZT precursor film and a baking process for crystallizing the PZT precursor film until a thickness of the formed electromechanical transducer film becomes a predetermined thickness. When an atomic weight ratio (Pb/(Zr+Ti)) of average Pb included in the formed electromechanical transducer film having the predetermined thickness is denoted by Pb(avg) and an atomic weight ratio (Pb/(Zr+Ti)) of Pb in any one of laminate interfaces of the plural PZT thin films included in the formed electromechanical transducer film is denoted by Pb(interface), the Pb(avg) is greater than or equal to 100 atomic percentage and less than or equal to 110 atomic percentage, and a fluctuation ratio ΔPb=Pb(avg)−Pb(interface) of Pb in the one of the laminate interfaces is less than or equal to 20 percent.

In the embodiments, the fluctuation ratio ΔPb is defined to be a reduced amount of an atomic weight ratio of Pb that resides in a laminate interface of the PZT thin films forming the electromechanical transducer film (Pb (interface)) with respect to an atomic weight ratio of average Pb included in the electromechanical transducer film formed to have the predetermined thickness (Pb(avg)). With this, the content of Pb in the electromechanical transducer film is substantially homogenized in the thickness direction and regulated to be within a predetermined range, thereby suppressing a characteristic change during a continuous operation. Specifically, Pb(avg) is regulated to be within a range from 100 atomic percentage (at %) to 110 at %, and ΔPb is regulated to be less than or equal to 20%. In this manner, as indicated in the experiments described below, the variation of the electromechanical transducing characteristic with respect to the electromechanical transducing characteristic in the initial state can be suppressed to be in a small range.

According to the embodiments, an electromechanical transducer element whose characteristic does not change substantially during a continuous operation, a droplet discharge head including the electromechanical transducer element, and a droplet discharge device including the droplet discharge head can be provided.

Other objects, features and advantages of the present invention will become more apparent from the following detailed description when read in conjunction with the accompanying figures.

DETAILED DESCRIPTION OF THE PREFERRED EMBODIMENTS

Figure 1:
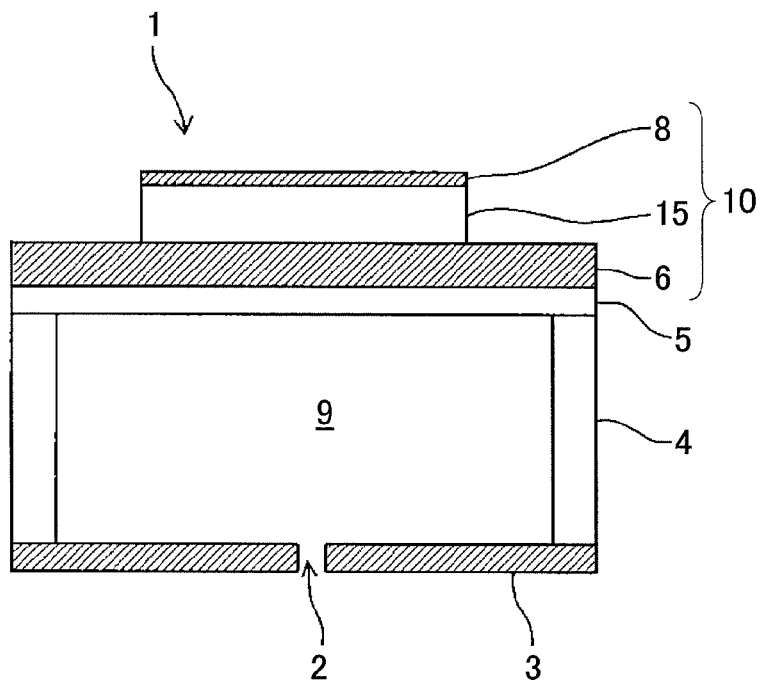
FIG. 1 is a cross-sectional view showing an example of a droplet discharge head.

When the electromechanical transducer film is formed by laminating the plural thin films of the PZT by repeating formation and baking of the PZT precursor film several times, a compositional change (compositional gradation) occurs in the thickness direction in the formed electromechanical transducer film, and the content ratio of Zr is out of the vicinity of the specific content ratio of Zr corresponding to the MPB, even if the component composition of the PZT precursor film is adjusted so that the component composition is in the vicinity of a specific component composition corresponding to the MPB. This is because, when the PZT precursor films are baked, a content ratio of Ti is significantly decreased at a boundary portion between the laminated PZT precursor films, and accordingly the content ratio of Zr is significantly increased and the content ratio of Zr deviates from the vicinity of the specific content ratio of Zr corresponding to the MPB. Therefore, it is difficult to obtain desired electromechanical transducing characteristics with the electromechanical transducer film.

The methods disclosed in Patent Documents 1, 2, and 3 try to solve the problem that the content ratio of Zr deviates from the vicinity of the specific content ratio of Zr corresponding to the MPB, by suppressing the reduction of the Ti component at the boundary portion between the PZT thin films, which are laminated to form a PZT film having a desired thickness.

On the other hand, the inventors of the present invention have found that in the electromechanical transducer film formed by laminating plural PZT thin films by repeating formation and baking of the PZT precursor film several times in accordance with the known method, a content ratio of Pb is significantly decreased at a boundary portion between the laminated PZT thin films, and thereby the electromechanical transducing characteristic of the electromechanical transducer film after a continuous operation is significantly changed from the electromechanical transducing characteristic of the electromechanical transducer film prior to the continuous operation. Namely, even if, initially, a desired electromechanical transducing characteristic is maintained, after the continuous operation, the electromechanical transducing characteristic is changed, and the desired electromechanical transducing characteristic is not obtained. Therefore, in the droplet discharging head that adopts the electromechanical transducer element, amounts of the droplets discharged during the continuous operation vary. Furthermore, when images are formed by a droplet discharge device that utilizes the droplet discharge head, it is possible that degradation of image quality occurs during the continuous operation. Patent Documents 2 and 3 disclose that the content ratios of Ti and Zr in the electromechanical transducer film formed of the PZT are homogenized in the thickness direction. However, Patent Documents 2 and 3 do not disclose homogeneity of the content ratio of Pb.

Such a problem can also be found in electromechanical transducer elements that are utilized in devices other than the droplet discharge head including the electromechanical transducer element. The embodiments of the present invention have been developed in view of the above problems.

Hereinafter, the embodiments are explained by referring to the accompanying figures. FIG. 1 is a cross sectional view illustrating an example of a droplet discharge head according to an embodiment. The droplet discharge head 1 shown in FIG. 1 includes a nozzle plate 3 in which a nozzle 2 is formed, a fluid channel forming substrate 4, and a base substrate 5 including an oscillation plate. The nozzle plate 3, the fluid channel forming substrate 4 and the base substrate 5 are laminated, and a compression chamber 9 for storing a liquid supplied to the nozzle 2 is formed. An electromechanical transducer element 10 is attached, as a discharge driving unit, to the base substrate 5 forming a portion of the compression chamber 9.

Figure 2:
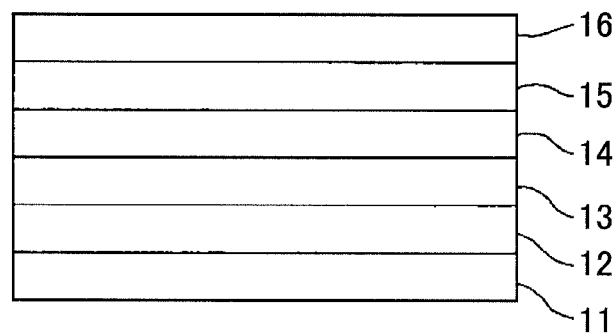
FIG. 2 is a configuration diagram of an electromechanical transducer element according to an embodiment.

FIG. 2 is a cross-sectional view showing a basic structure of layers of the electromechanical transducer element 10 according to the embodiment. In the electromechanical transducer element 10 shown in FIG. 2, a substrate 11, an oscillation plate 12, a first electrode 13, a second electrode 14, an electromechanical transducer film 15, and a third electrode 16 are laminated. The first electrode 13 is a metal electrode, and the second electrode 14 is an oxide electrode. The first electrode 13 and the second electrode 14 are forming a lower electrode (corresponding to an element 6 in FIG. 1). The third electrode 16 is a metal electrode or an electrode formed of an oxide electrode and a metal electrode. The third electrode 16 is forming an upper electrode (corresponding to an element 8 in FIG. 1).

The electromechanical transducer film 15 included in the electromechanical transducer element 10 is produced by forming a thin film of PZT having a thickness of 0.9 µm. The PZT is a complex oxide including lead (Pb), titanium (ti), and zirconium (Zr). The electromechanical transducer film 15 having the predetermined thickness is formed by repeating a film forming process including a precursor film forming process for laminating plural precursor films and a baking process for crystallizing the precursor films several times, and thereby laminating the PZT thin films.

In the embodiment, the electromechanical transducer film 15, which is formed of the PZT, is formed by repeating a film forming process including the baking process several times until the electromechanical transducer film 15 having a desired thickness is formed. In such a case, Pb/(Zr+Ti), which is an atomic weight ratio between Pb included in a laminate interface adjacent to the PZT thin film and the PZT thin film included in the electromechanical transducer film 15, is defined as described below.

Figure 3:
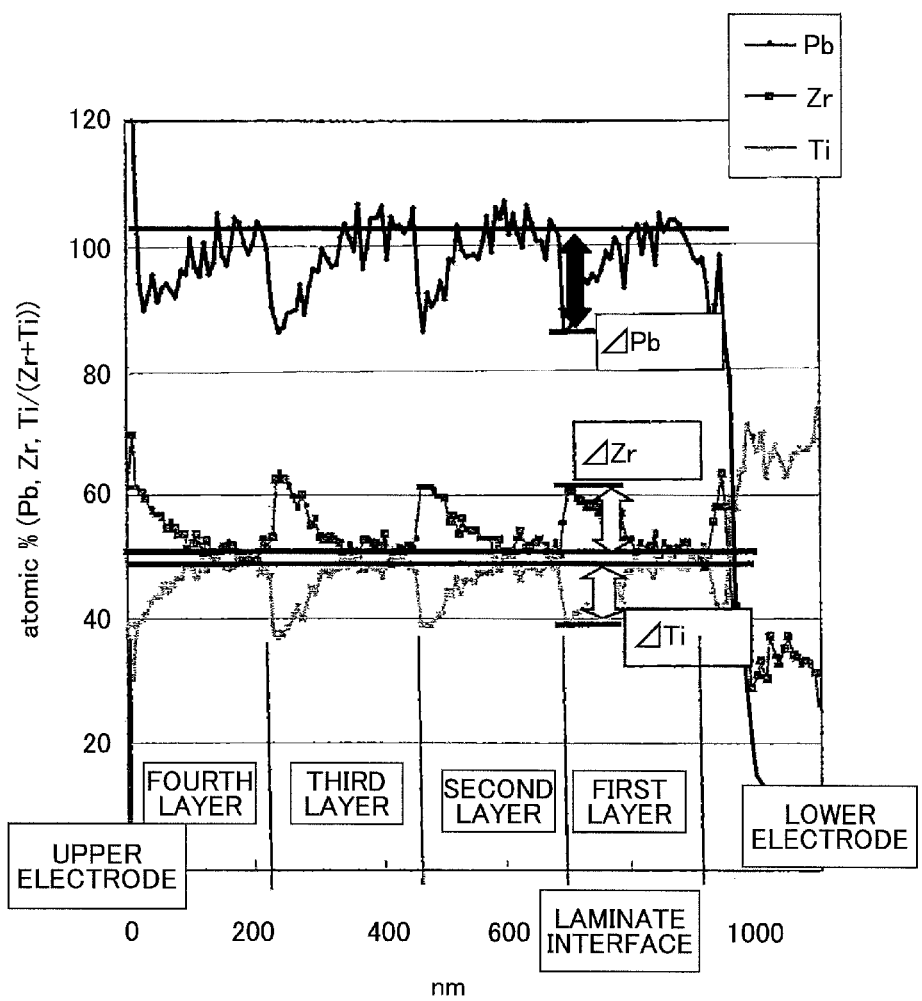
FIG. 3 is a graph showing a result of the Secondary Ion Mass Spectrometry (SIMS) of an electromechanical transducer film in a depth direction, after forming the electromechanical transducer film having a predetermined thickness.

FIG. 3 is a graph showing a result of the Secondary Ion Mass Spectrometry (SIMS) of the electromechanical transducer film 15 in the depth direction of the film, after forming the electromechanical transducer film 15 having a predetermined thickness. The vertical axis of FIG. 3 indicates a depth of the film from the upper electrode. The vertical axis indicates atomic weight ratios of Pb, Zr, and Ti with respect to (Zr+Ti). Here, the atomic weight ratios of Pb, Zr, and Ti are calculated by converting sensitivity coefficients into atomic weight ratios. The sensitivity coefficients are obtained based on film composition data, which is obtained by the inductively coupled plasma (ICP) emission spectrometry.

In order to form the electromechanical transducer film 15 having a desired thickness, plural PZT thin films are laminated by performing the baking process for crystallizing the PZT thin films several times. However, by the baking process, the amounts of Pb and Ti at a boundary portion between the PZT thin films are decreased. For the sample of FIG. 3, 4 layers of the PZT thin films are laminated by performing the baking process 4 times. FIG. 3 shows that the contents of the corresponding elements with respect to the average atomic weight ratios of the corresponding elements are varied at the boundary portion between the laminated PZT thin films.

For the electromechanical transducer film 15, the variation amount of the atomic weight ratio of Pb in the laminate interface, to which the baking process has been applied, is quantified by $\Delta Pb$ described below. Here, the atomic weight ratio of average Pb included in the electromechanical transducer film 15 (Pb/(Zr+Ti)) is denoted by Pb(avg), and the atomic weight ratio of Pb(Pb/(Zr+Ti)) in the laminate interface between the PZT thin film to n times of the baking processes have been applied and the PZT thin film to which (n+1) times of the baking processes have been applied is denoted by Pb (interface). Here, the PZT thin film to which n times of the baking processes have been applied and the PZT thin film to which (n+1) times of the baking processes have been applied are included in the electromechanical transducer film 15. At this time, $\Delta Pb$, which represents a decreasing rate of Pb in the laminate interface, can be expressed as Pb(avg)−Pb(interface). Here, degradation of the electromechanical transducing characteristic during a continuous operation is prevented by regulating the content of Pb in the electromechanical transducer film 15 to be uniform in the depth direction. Namely, the Pb(avg) is regulated to be within a range which is greater than or equal to 100 atomic percentage (at %) and less than or equal to 110 at %, and $\Delta Pb$ is regulated to be less than or equal to 20%. Further, the effect of preventing the degradation of the electromechanical transducing characteristic during the continuous operation becomes greater, when the Pb(avg) is regulated to be within a range which is greater than or equal to 103 at % and less than or equal to 107 at %, and the $\Delta Pb$ is regulated to be less than or equal to 10%. On the other hand, when the Pb(avg) is less than 100 at % or greater than 110 at %, or when $\Delta Pb$ is greater than 20%, the electromechanical transducing characteristic during the continuous operation is significantly degraded, and the deformation amount is significantly reduced compared to the deformation amount in the initial state. Furthermore, when the Pb(avg) is less than 100 at % or greater than 110 at %, a withstand voltage is lowered, and electrode leakage is increased.

Further, for the electromechanical transducer film 15 according to the embodiment, the variation amounts of the atomic weight ratios of Zr and Ti in the laminate interface, to which the baking process has been applied, are quantified, similar to the case of Pb. The total amount of (Zr+Ti) is constant. As described above, at the boundary portion between the laminated PZT thin films, the content of Ti is decreased by the baking process, and accordingly the content rate of Zr is increased. Therefore, the variation amounts of the atomic weight ratios of Zr and Ti are defined by quantifying the variation amount of the atomic weight ratio of Zr by $\Delta Zr$ described below.

Here, the atomic weight ratio of average Zr included in the electromechanical transducer film 15 (Zr/(Zr+Ti)) is denoted by Zr(avg), and the atomic weight ratio (Zr/(Zr+Ti)) of Zr on the laminated interface between the PZT thin film to which n times of the baking processes have been applied and the PZT thin film to which (n+1) times of the baking processes have been applied is denoted by Zr (interface). The PZT thin film to which n times of the baking processes have been applied and the PZT thin film to which (n+1) times of the baking processes have been applied are included in the electromechanical transducer film 15. Here, an increasing rate $\Delta Zr$ of Zr at the laminated interface can be expressed by Zr (interface)−Zr(avg). An excellent electromechanical transducing characteristic is obtained by regulating the $\Delta Zr$ to be less than or equal to 20%. Further, the effect of suppressing the degradation of the electromechanical transducing characteristic becomes large, when the $\Delta Zr$ is regulated to be less than or equal to 10%. On the other hand, the electromechanical transducing characteristic is not good, when $\Delta Zr$ is greater than 20%.

Further, it is preferable that Zr(avg), which is the atomic weight ratio of average Zr in the electromechanical transducer film 15, be in a range which is greater than or equal to 40 at % and less than or equal to 70 at %. It is more preferable that Zr(avg) be in a range which is greater than or equal to 50 at % and less than or equal to 60 at %. When Zr(avg) is less than 40 at % or greater than 70 at %, the difference between the deformation amounts of the electromechanical transducer film 15 prior to and after the continuous operation becomes large, and the deformation amount is significantly decreased compared to the deformation amount in the initial state. Further, a fine electromechanical transducing characteristic may not be obtained in the initial state, and the deformation amount may be small.

Further, as shown in FIG. 3, it is preferable that each layer included in a four-layer PZT thin film be in a range from 200 nm to 300 nm. Here, the four-layer PZT thin film is formed by applying the baking process 4 times. When the film thickness of the PZT thin film is less than 200 nm, the number of application of the baking process for forming the electromechanical transducer film 15 having a predetermined thickness is increased. Therefore, the effect of variations in the composition of the elements in the boundary portions of the laminated layers becomes large, and it is difficult to obtain a sufficient electromechanical transducing characteristic. On the other hand, when the film thickness is greater than 300 nm, cracks tend to occur in the electromechanical transducer film 15.

Next, components of the electromechanical transducer element 10 are concretely explained.

<Substrate>

As the substrate 11, it is preferable to utilize a silicone single-crystal substrate. The thickness of the substrate 11 is preferably in a range from 100 μm to 600 μm. There are three types of plane directions, namely, plane directions of (100), (110), and (111). In general, in the semiconductor industry, the plane direction (100) and the plane direction (111) are widely used. Thus, in the embodiment, a single-crystal substrate having the plane direction (100) is mainly used. Further, when the fluid channel forming substrate 4 for forming the compression chamber 9 of the droplet discharge head 1 in FIG. 1 is produced from the substrate 11, the silicone single crystal substrate is processed by the etching. As a method of the etching, usually anisotropic etching is utilized.

In the anisotropic etching, a property of the silicone single-crystal substrate is utilized. Namely, the property is such that the etching speed differs depending on the plane direction of the crystal structure. For example, for the anisotropic etching in which the silicone single-crystal substrate is immersed in an alkaline solution, such as KOH, the etching speed for the plane corresponding to the plane direction (111) is about 1/400 compared to the etching speed for the plane corresponding to the plane direction (100). In the plane direction (100), a structure having an inclination of about 54 degrees is produced. On the other hand, in the plane direction (110), a deep groove is formed. Therefore, in the plane direction (110), an array density can be increased while the stiffness is maintained. In the embodiment, the single-crystal substrate having the plane direction (110) may be utilized. However, in such a case, $SiO_2$, which is a mask material, may be etched.

<Oscillation Plate>

The oscillation plate 12 is a base substrate for forming the electromechanical transducer film 15. When the oscillation plate 12 receives a force generated by the electromechanical transducer film 15, the oscillation plate 15 is deformed, and thereby the oscillation plate 12 causes the droplet discharge head 1 shown in FIG. 1 to discharge droplets of the ink inside the compression chamber 9. Therefore, it is preferable that the oscillation plate 12 have predetermined stiffness. Examples of materials of the oscillation plate 12 include Si, $SiO_2$, and $Si_3N_4$ that are produced by the chemical vapor deposition (the CVD method). Further, as a material of the oscillation plate 12, it is preferable to select a material having a linear expansion coefficient that is close to the linear expansion coefficients of the first electrode 13, the second electrode 14, and the electromechanical transducer film 15.

Since the PZT is used for the electromechanical transducer film 15, it is preferable that the material of the oscillation plate have a linear expansion coefficient in a range from $5 \times 10^{-6}$ to $10 \times 10^{-6}$ (1/K), which is close to the linear expansion coefficient of the PZT, that is $8 \times 10^{-6}$ (1/K). It is more preferable that the material of the oscillation plate have a linear expansion 1.0 coefficient in a range from $7 \times 10^{-6}$ to $9 \times 10^{-6}$ (1/K).

Concrete examples of the material of the oscillation plate include aluminum oxide, zirconium oxide, iridium oxide, ruthenium oxide, tantalum oxide, hafnium oxide, osmium oxide, rhenium oxide, rhodium oxide, palladium oxide, and a compound thereof. The oscillation plate 12 may be formed of any of the above materials by the sputtering method or the sol-gel method, in which a spin coater is utilized.

It is preferable that the oscillation plate 12 have a film thickness in a range from 0.1 μm to 10 μm. It is more preferable that the film thickness be in a range from 0.5 μm to 3 μm. When the film thickness of the oscillation plate 12 is less than 0.1 μm, it is difficult to process the pressure chamber 9 as shown in FIG. 1. On the other hand, when the film thickness of the oscillation plate 12 is greater than 10 μm, it is difficult to deform the oscillation plate 12, and the discharging characteristic of discharging the ink is not stable.

<First Electrode>

Platinum may be utilized as a metal material of the first electrode 13. Platinum has a high heat resistance and a low reactivity. However, since platinum may not have a sufficient barrier property against lead, it is preferable to utilize a platinum group metal, such as iridium, platinum-rhodium, or an alloy film thereof, as the material of the first electrode 13. In addition, platinum does not have a sufficient adhesive property with respect to the oscillation plate 12 (especially, with respect to $SiO_2$), which is the base substrate. Therefore, when platinum is utilized as the material of the first electrode 13, it is preferable to laminate an adhesive layer in advance as a lower layer of the first electrode 13. As a material of the adhesive layer, for example, Ti, $TiO_2$, Ta, $Ta_2O_5$, or $Ta_3N_5$ may be utilized. As a producing method of the first electrode 13, the sputtering method or the vacuum deposition may be utilized. It is preferable that the film thickness of the first electrode be in a range from 0.05 μm to 1 μm, and it is more preferable that the thickness be in a range from 0.1 μm to 0.5 μm.

<Second Electrode>

When a complex oxide including lead is utilized as the electromechanical transducer film 15, it is possible that the lead included in the electromechanical transducer film 15 reacts with the second electrode 14 or the lead is dispersed in the second electrode 14. Thus, it is possible that the electromechanical transducing property of the electromechanical transducer film 15 is degraded. Therefore, as a material of the second electrode 14, a material having a barrier property against the reaction with the lead and/or the dispersion of the lead may be required.

It is effective to utilize a conductive oxide as the material of the second electrode. As a concrete material of the second electrode 14, the following may be considered. Namely, a complex oxide, such as $SrRuO_3$ and $CaRuO_3$; $(Sr_{1-x}Ca_x)O_3$ which is a solid solution of the complex oxide; La $NiO_3$, $SrCOO_3$, and solid solutions thereof, namely, (La, Sr) $(Ni_{1-y}CO_y)O_3$ (y may be 1), can be considered. Here, the complex oxide can be expressed by a chemical formula of $ABO_3$, where A=Sr, Ba, Ca, or La; and B=Ru, CO, or Ni. Besides the oxide materials described above, for example, $IrO_2$ and $RuO_2$ can be considered as the material of the second electrode.

The second electrode 14 may be formed by the sputtering method or the sol-gel method, in which a spin coater is utilized. It is possible that patterning is applied to a portion of the formed film. In such a case, a desired pattern is formed, for example, by photolithographic etching. It is preferable that the film thickness be in a range from 0.05 μm to 1 μm, and it is more preferable that the thickness be in a range from 0.1 μm to 0.5 μm.

<Electromechanical Transducer Film>

In the embodiment, the PZT is utilized as the material of the electromechanical transducer film 15. The PZT is a solid solution of lead zirconate ($PbZrO_3$) and lead titanate ($PbTiO_3$). The characteristic of the PZT depends on a ratio between lead zirconate and lead titanate. When the ratio between $PbZrO_3$ and $PbTiO_3$ is 53:47, the PZT demonstrates an excellent piezoelectric characteristic. In such a case, the composition of the PZT can be expressed by a chemical formula of $Pb(Zr0.53, Ti0.47)O_3$, and in general, it is expressed by PZT (57/47).

The electromechanical transducer film 15 can be produced by the sol-gel method, in which the spin coater is utilized. The sol-gel method is a chemical solution deposition. When the electromechanical transducer film 15 is produced by the sol-gel method, patterning may be required. In such a case, a desired pattern may be formed, for example, by the photolithographic etching.

When the electromechanical transducer film 15 is produced by the sol-gel method, a compound of lead acetate, zirconium alkoxide, and titanalkoxide is utilized as a starting material, and a homogeneous solution is obtained by dissolving the compound into methoxyethanol, which is used as a common solvent. In this manner, a PZT precursor solution is produced. Since a metal alkoxide compound is easily hydrolyzed by moisture in the air, a suitable amount of a stabilizing agent, such as acetylacetone, acetic acid, or diethanolamine, may be added to the precursor solution.

When the PZT film is formed on the entire surface of the oscillation plate 12, which is the base substrate, a coating film is formed by a solution coating method, such as the spin coating method, and the PZT film is formed by applying heating processes including a solvent drying process, a thermal decomposition process, and a crystallization process. Since the transformation from the coating film into a crystallized film is accompanied by volume shrinkage, in order to obtain a crack-free film, the density of the precursor is adjusted so that a film having a thickness of less than or equal to 100 nm is obtained per one time of the application process (the process including the application process, the solvent drying process, and the thermal decomposition process). It is preferable that a film having a thickness in a range from 200 nm to 300 nm be obtained by repeating the application process and performing a baking process for crystallization (after repeating the application process, the solvent drying process, and the thermal decomposition process, finally the crystallization process is applied). When the thickness of the film is greater than 300 nm, cracks tend to occur in the film. On the other hand, when the thickness of the film is less than 200 nm, many temperature hystereses occur, and a failure due to an insufficient amount of Pb tends to occur.

It is preferable that the thickness of the electromechanical transducer film 15 be in a range from 0.5 µm to 5 µm, and it is more preferable that the thickness be in a range from 1 µm to 2 µm. When the thickness of the electromechanical transducer film 15 is less than 0.5 µm, a deformation amount may be insufficient. On the other hand, when the thickness of the electromechanical transducer film 15 is greater than 5 µm, since plural layers are laminated, the number of the processes applied is increased, and the processing time period becomes longer.

Figure 4:
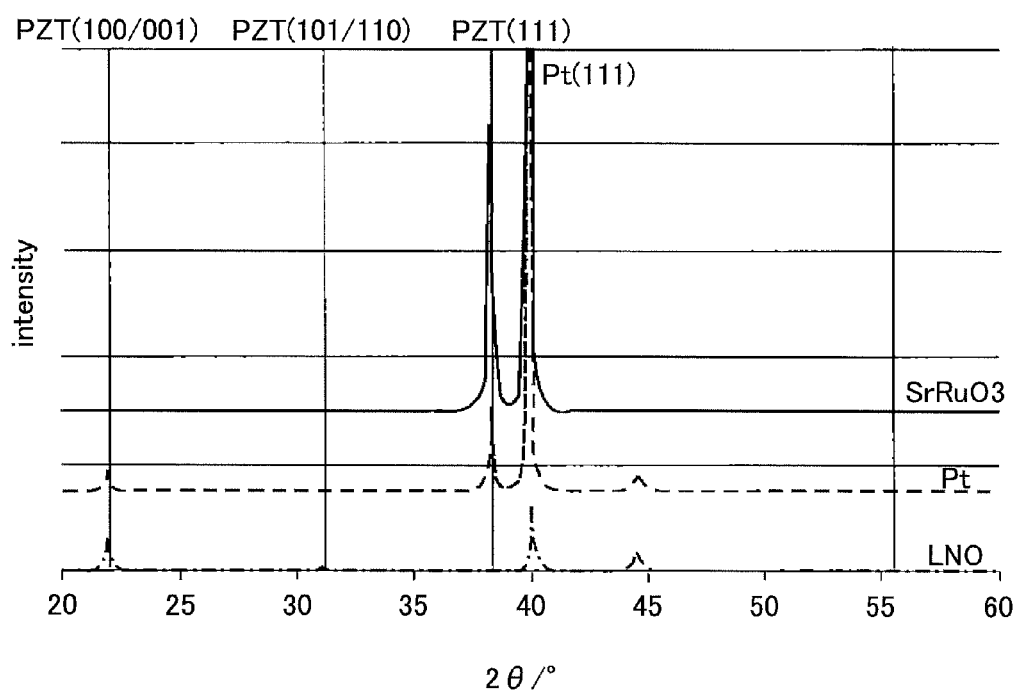
FIG. 4 is a graph of X-ray diffraction θ-2θ scans of electromechanical transducer films formed of PZT, for which different types of electrodes are utilized.

The crystal orientation of the electromechanical transducer film 15 varies depending on the type of the material of the first electrode 13, or depending on the types of the materials of the first electrode 13 and the second electrode 14. FIG. 4 shows results of X-ray diffraction θ-2θ scans of the electromechanical transducer films 15, which are measured by an X-ray diffractometer (XRD). Here, the electromechanical transducer films 15 are formed by the PZT under the same condition, but the types of the electrodes included in the corresponding electromechanical transducer films 15 are different.

FIG. 4 indicates the following. When platinum is selected as the material of the first electrode 13 (and Ti is selected as the material of the adhesive layer) and $SrRuO_3$ is selected as the material of the second electrode 14, the crystal plane (111) is preferentially oriented. When platinum is selected as the material of the first electrode 13 (and Ti is selected as the material of the adhesive layer) and $LaNiO_3$ is selected as the material of the second electrode 14, the crystal plane (100) or the crystal plane (001) are preferentially oriented. When platinum is selected as the materials of the first electrode 13 and the second electrode 14 (and Ti is selected as the material of the adhesive layer), the crystal planes (111), (100), and (001) are mixed. By observing the deformation amounts of the electromechanical transducer film 15 prior to and after a continuous operation, it was found that, for the electromechanical transducer film 15 in which the PZT (111) was preferentially oriented, a degradation amount of the deformation was small and a relatively fine result was obtained. For the electromechanical transducer film 15 in which the PZT (111) is preferentially oriented, it is a very small amount but (110)-oriented PZT can be observed, as shown in FIG. 4. It is preferable that, when the Lotgering method is utilized, a degree of orientation in the plane direction (111) be greater than or equal to 0.85 and a degree of orientation in the plane direction (110) be less than or equal to 0.10 in the electromechanical transducer film 15. When the degree of orientation in the plane direction (111) is less than 0.85 or the degree of orientation in the plane direction (110) is greater than 0.10, the degradation amount of the deformation becomes large.

The degree of orientation determined by using the Lotgering method is defined to be an orientation ratio with respect to the sum of all the peaks of corresponding orientations obtained by the X-ray diffraction. Here, the sum of all the peaks of the corresponding orientations is set to be 1. Namely, the degree of orientation is the average degree of orientation obtained by the following formula, where the denominator is set to be the sum of all the peak intensities, and the numerator is set to be a peak intensity of an arbitrary orientation.

$$\rho = \Sigma I(00l)/\Sigma I(hkl)$$

<Third Electrode>

As a material of the third electrode 16, it is effective to utilize a conductive oxide, similar to the case of the second electrode 14. As a concrete material of the third electrode 16, the following may be considered. Namely, a complex oxide, such as $SrRuO_3$ and $CaRuO_3$; $(Sr_{1-x}Ca_x)O_2$ which is a solid solution of the complex oxide; $LaNiO_2$, $SrCOO_3$, and solid solutions thereof, namely, $(La, Sr)(Ni_{1-y}CO_y)O_3$ (y may be 1), can be considered. Here, the complex oxide can be expressed by a chemical formula of $ABO_2$, where A=Sr, Ba, Ca, or La; and B=Ru, CO, or Ni. Besides the oxide materials described above, for example, $IrO_2$ and $RuO_2$ can be considered. It is effective to use a platinum group metal, such as platinum, iridium, platinum rhodium, or alloy film thereof; Ag alloy, Cu, Al, or Au on the conductive oxide, so as to compensate for wiring resistance.

The third electrode 16 can be produced by the sputtering method or the sol-gel method, in which the spin coater is utilized. When the third electrode 16 is produced by the sputtering method or the sol-gel method, patterning may be required. In such a case, a desired pattern is obtained, for example, by photolithographic etching. It is preferable that the thickness of the third electrode 16 be in a range from 0.05 µm to 1 µm, and it is more preferable that the thickness be in a range from 0.1 µm to 0.5 µm.

Figure 5A:
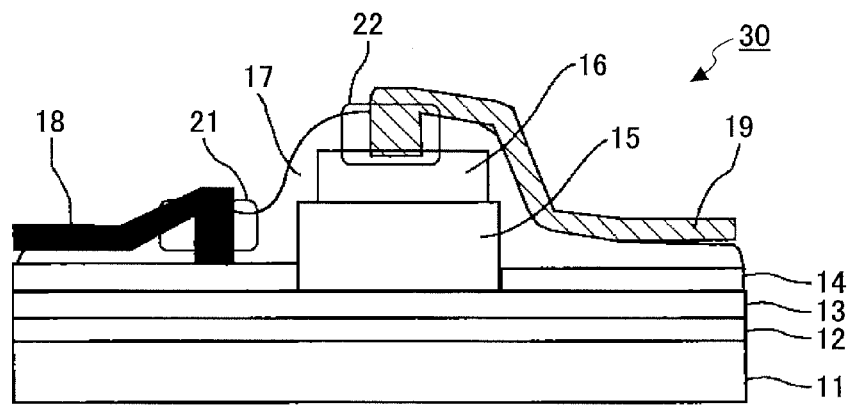
FIG. 5A is a cross-sectional view of another example of the electromechanical transducer element according to the embodiment.
Figure 5B:
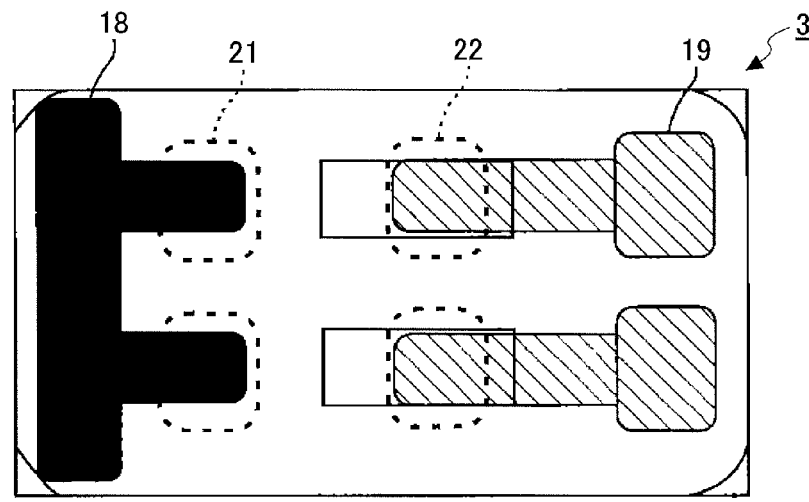
FIG. 5B is a plan view of the another example of the electromechanical transducer element according to the embodiment.

FIGS. 5A and 5B are another example of an electromechanical transducer element 30 according to the embodiment. FIG. 5A is a cross-sectional view of the electromechanical transducer element 30. FIG. 5B is a plane view of the electromechanical transducer element 30. The electromechanical transducer element 30 shown in FIGS. 5A and 5B includes the substrate 11, the oscillation plate 12, the first electrode 13, the second electrode 14, the electromechanical transducer film 15, the third electrode 16, an insulating protective film 17, a fourth electrode 18, and a fifth electrode 19. Since the substrate 11, the oscillation plate 12, the first electrode 13, the second electrode 14, the electromechanical transducer film 15, and the third electrode 16 are the same as those included in the electromechanical transducer element 10 in FIG. 2, the explanations for these elements are omitted. In the electromechanical transducer element 30, the insulating protective film 17 is formed to cover the second electrode 14, the electromechanical transducer film 15, and the third electrode 16. The fourth electrode 18 is disposed on the insulating protective film 17, and the fourth electrode 18 is electrically connected to the first electrode 13 through first contact holes 21 that pass through the insulating protective film 17. The fifth electrode 19 is disposed on the insulating protective film 17, and the fifth electrode 19 is electrically connected to the third electrode 16 through a second contact hole 22 that passes through the insulating protective film 17. The second electrode 14, the third electrode 16, and the fifth electrode 19 are individual electrodes that are individually attached to each of the electromechanical transducer films 15. The first electrode 13 and the fourth electrode 18 are common electrodes that are commonly attached to all the electromechanical transducer films 15.

By forming such an insulating protective film 17 in the electromechanical transducer element 30 shown in FIGS. 5A and 5B, a failure caused by, for example, an electrical short circuit can be prevented from occurring and the electromechanical transducer film 15 can be prevented from being broken by moisture or a gas.

Next, the components of the electromechanical transducer element 30 in FIGS. 5A and 5B are concretely explained.

<Insulating Protective Film>

The insulating protective film 17 is provided for preventing a failure caused by an electrical short circuit or the like and for preventing the electromechanical transducer film 15 from being broken by moisture or a gas. It is preferable to use, as a material of the insulating protective film 17, an inorganic film, such as a silicon oxide film, a silicon nitrate film, or a nitride oxide silicon film; or an organic film, such as a polyimide film or a parylene film. The thickness of the insulating protective film 17 is preferably in a range from 0.5 µm to 20 µm, and it is more preferable that the thickness be in a range from 1 µm to 10 µm. When the thickness of the insulating protective film 17 is less than 0.5 µm, the function of the insulating protective film 17 is insufficient. On the other hand, when the thickness of the insulating protective film 17 is greater than 20 µm, the processing time period becomes longer.

As a producing method of the insulating protective film 17, the CVD method, the sputtering method, or the spin coating method can be utilized. Further, for forming the first contact holes 21 for connecting the fourth electrode 18 to the first electrode 13 and the second contact holes 22 for connecting the fifth electrodes 19 to the corresponding third electrodes 16, photolithographic etching may be utilized to form desired patterns.

<Fourth Electrode, Fifth Electrode>

The materials of the fourth electrode 18 and the fifth electrode 19 are preferably any metal material of an Ag alloy, Cu, Al, Au, Pt, or Ir. The fourth electrode 18 and the fifth electrode 19 can be produced by the sputtering method or the spin coating method. Subsequently, desired patterns can be formed by the photolithographic etching. Additionally, a patterned film formed by the inkjet method can be obtained by applying a process of modifying a portion of the surface of the insulating protective film 17, which is the base substrate.

The film thickness of each of the fourth electrode 18 and the fifth electrode 19 is preferably in a range from 0.1 µm to 20 µm, and it is more preferable that the film thickness be in a range from 0.2 µm to 10 µm. When the film thickness of each of the fourth electrode 18 and the fifth electrode 19 is less than 0.1 µm, the resistance is increased and hence it becomes difficult to supply sufficient electric current to the electrodes. Thus, the droplet discharging characteristic of the droplet discharge head becomes unstable. On the other hand, when the film thickness is greater than 20 µm, the processing time period becomes longer.

Hereinafter, first through sixth embodiments are explained.

First Embodiment

First, a thermal oxide film (film thickness: 1 µm) was formed on a silicon wafer. On the thermal oxide film, a titanium film (film thickness: 50 nm) and subsequently a platinum film (film thickness: 200 nm) were formed by the sputtering method. The titanium film functioned as an adhesive layer for increasing the adhesiveness between the thermal oxide film and the platinum film. Next, a film of SrRuO (film thickness: 60 nm) was formed as the second electrode 14 by the sputtering method.

Figure 6:
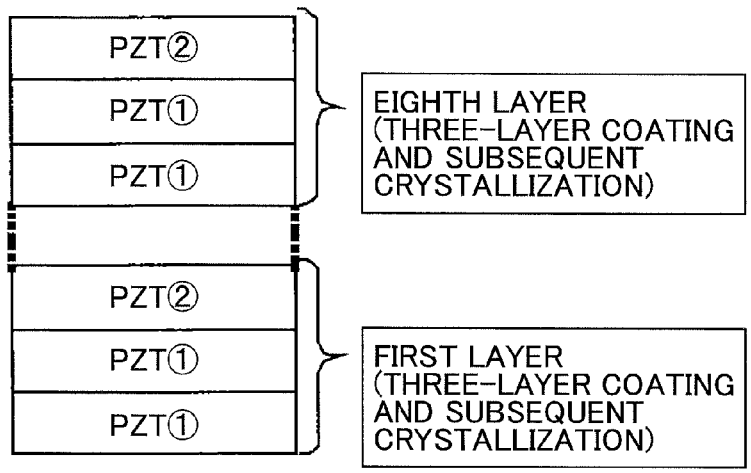
FIG. 6 is a diagram illustrating a laminated film according to a first embodiment.

After that, a laminated film as shown in FIG. 6 was formed as the electromechanical transducer film 15 by using the following two types of solutions.

PZT solution 1 (Pb:Zr:Ti=110:53:47)
PZT solution 2 (Pb:Zr:Ti=120:53:47)

Specifically, lead acetate trihydrate, zirconium isopropoxide, and titanium isopropoxide were used as the starting materials for synthesizing the precursor solution. Crystal water of lead acetate was dissolved into methoxyethanol, and the resultant mixture was dehydrated. The amount of lead was adjusted to exceed the amount of lead defined by the stoichiometric composition. This was for preventing a so-called "degradation of crystallinity caused by insufficient lead" during a heating process. A PZT precursor solution was synthesized as follows. First, zirconium isopropoxide and titanium isopropoxide were dissolved into methoxyethanol. Then the alcohol exchange reaction and the esterification reaction were accelerated. The PZT precursor solution was synthesized by mixing the resultant solution with the above methoxyethanol solution, in which lead acetate was dissolved. The molar concentration of the PZT was adjusted to be 0.5 mol/L. A film was formed of this solution by the spin coating method. After the film was formed, the film was dried at 120 degrees Celsius, and the dried film was thermally decomposed at 500 degrees Celsius. Here, as shown in FIG. 6, the PZT solution 1 was used for forming the first layer and the second layer, and the PZT solution 2 was used for forming the third layer. After the third layer was formed, a crystallization heat treatment (at 750 degrees Celsius) was performed as a rapid heat treatment. At that time, the film thickness of the PZT film was 240 nm. The above processes were repeated 8 times (24 layers), and the electromechanical transducer film 15 was obtained. Here, the electromechanical transducer film 15 was formed of the PZT film having a film thickness of about 2 µm.

Subsequently, a film of SrRuO (film thickness: 60 nm) and a film of Pt (film thickness: 100 nm) was formed as the third electrode 16 by the sputtering method. After that, a film of a photoresist (TSMR8800, a product of Tokyo Ohka Kogyo Co., Ltd.) was formed by the spin coating method. After the resist patterns were formed by the normal photolithography, patterns were processed by using an inductively coupled plasma (ICP) etching device (a product of SAMCO, Inc.)

Next, a parylene film (film thickness: 2 µm) was formed as the insulating protective film 17 by the CVD method. After that, a film of the photoresist (TSMR8800, the product of Tokyo Ohka Kogyo Co., Ltd.) was formed by the spin coating method. After the resist pattern was formed by the normal photolithography, the pattern shown in FIGS. 5A and 5B were produced by using a dry etching device (RIE: a product of SAMCO, Inc.). Finally, an Al film (film thickness: 5 µm) was formed as the fourth electrode 18 and the fifth electrode 19 by the sputtering. Then, a film of photoresist (TSMR8800, the product of Tokyo Ohka Kogyo Co., Ltd.) was formed by the spin coating method, and the resist pattern was formed by the normal photolithography. Subsequently, the pattern shown in FIGS. 5A and 5B were produced by the dry etching device (RIE: the product of SAMCO, Inc.), and thereby the electromechanical transducer element 30 shown in FIGS. 5A and 5B was produced.

Second Embodiment

Figure 7:
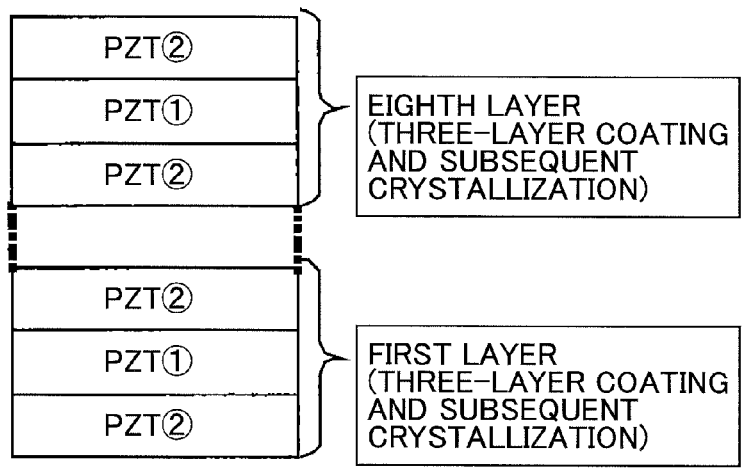
FIG. 7 is a diagram illustrating a laminated film according to a second embodiment.

A laminated film as shown in FIG. 7 was formed as the electromechanical transducer film 15 by using the following two types of solutions.

PZT solution 1 (Pb:Zr:Ti=110:53:47)
PZT solution 2 (Pb:Zr:Ti=115:53:47)
The electromechanical transducer element 30 was produced, similar to the case of the first embodiment, except for the above described configuration.

Third Embodiment

Figure 8:
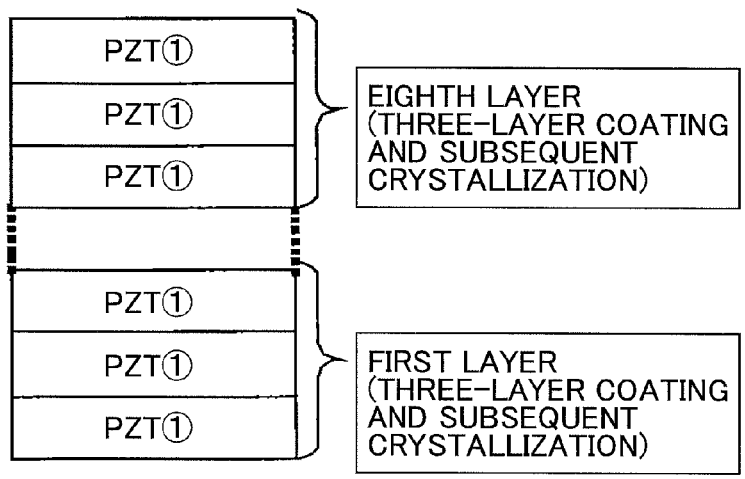
FIG. 8 is a diagram illustrating a laminated film according to a third embodiment.

A laminated film as shown in FIG. 8 was formed as the electromechanical transducer film 15 by using the following solution.
PZT solution 1 (Pb:Zr:Ti=113:53:47)
The electromechanical transducer element 30 was produced, similar to the case of the first embodiment, except for the above solution. Here, the thermal decomposition process after the formation of the film was performed under 350 degrees Celsius and the crystallization process was performed under 750 degrees Celsius.

Fourth Embodiment

A laminated film as shown in FIG. 6 was formed as the electromechanical transducer film 15 by using the following two types of solutions.
PZT solution 1 (Pb:Zr:Ti=113:53:47)
PZT solution 2 (Pb:Zr:Ti=113:47:53)
The electromechanical transducer element 30 was produced, similar to the case of the first embodiment, except for the above solutions. Here, the thermal decomposition process after the formation of the film was performed under 350 degrees Celsius and the crystallization process was performed under 750 degrees Celsius.

Fifth Embodiment

A laminated film as shown in FIG. 6 was formed as the electromechanical transducer film 15 by using the following two types of solutions.
PZT solution 1 (Pb:Zr:Ti=113:68:32)
PZT solution 2 (Pb:Zr:Ti=120:68:32)
The electromechanical transducer element 30 was produced, similar to the case of the first embodiment, except for the above solutions.

Sixth Embodiment

A laminated film as shown in FIG. 6 was formed as the electromechanical transducer film 15 by using the following two types of solutions.
PZT solution 1 (Pb:Zr:Ti=105:42:58)
PZT solution 2 (Pb:Zr:Ti=112:42:58)
The electromechanical transducer element 30 was produced, similar to the case of the first embodiment, except for the above solutions.

Comparative Example 1

A laminated film as shown in FIG. 8 was formed as the electromechanical transducer film 15 by using the following solution.
PZT solution 1 (Pb:Zr:Ti=110:53:47)
The electromechanical transducer element 30 was produced, similar to the case of the first embodiment, except for the above solution.

Comparative Example 2

A laminated film as shown in FIG. 8 was formed as the electromechanical transducer film 15 by using the following solution.
PZT solution 1 (Pb:Zr:Ti=125:53:47)
The electromechanical transducer element 30 was produced, similar to the case of the first embodiment, except for the above solution.

Comparative Example 3

A laminated film as shown in FIG. 8 was formed as the electromechanical transducer film 15 by using the following solution.
PZT solution 1 (Pb:Zr:Ti=113:53:47)
The electromechanical transducer element 30 was produced, similar to the case of the first embodiment, except for the above solution.

Comparative Example 4

A laminated film as shown in FIG. 6 was formed as the electromechanical transducer film 15 by using the following two types of solutions.
PZT solution 1 (Pb:Zr:Ti=113:36:64)
PZT solution 2 (Pb:Zr:Ti=120:36:64)
The electromechanical transducer element 30 was produced, similar to the case of the first embodiment, except for the above solutions.

Comparative Example 5

A laminated film as shown in FIG. 6 was formed as the electromechanical transducer film 15 by using the following two types of solutions.
PZT solution 1 (Pb:Zr:Ti=113:75:25)
PZT solution 2 (Pb:Zr:Ti=120:75:25)
The electromechanical transducer element 30 was produced, similar to the case of the first embodiment, except for the above solutions.

<Evaluation of First Through Sixth Embodiments and Comparative Examples 1-5>

The electromechanical transducer films formed in the first through sixth embodiments and in the comparative examples 1-5 were analyzed by the inductively coupled plasma (ICP) atomic emission spectrometry, and corresponding film compositions were obtained. Further, composition ratios of the corresponding electromechanical transducer films were analyzed in the thickness direction, as shown in FIG. 3, by the secondary ion mass spectrometry (SIMS).

Further, the electromechanical transducing characteristics (residual polarization Pr, piezoelectric constant d13) were evaluated for the electromechanical transducer elements 30 formed in the first through sixth embodiments and in the comparative examples 1-5. After the initial characteristics of the corresponding electromechanical transducer elements 30 were evaluated, the characteristics of the corresponding electromechanical transducer elements 30 were evaluated immediately after completion of corresponding endurance tests (application of voltages were repeated $10^{10}$ times). Table 1 shows details of the results.

Figure 9:
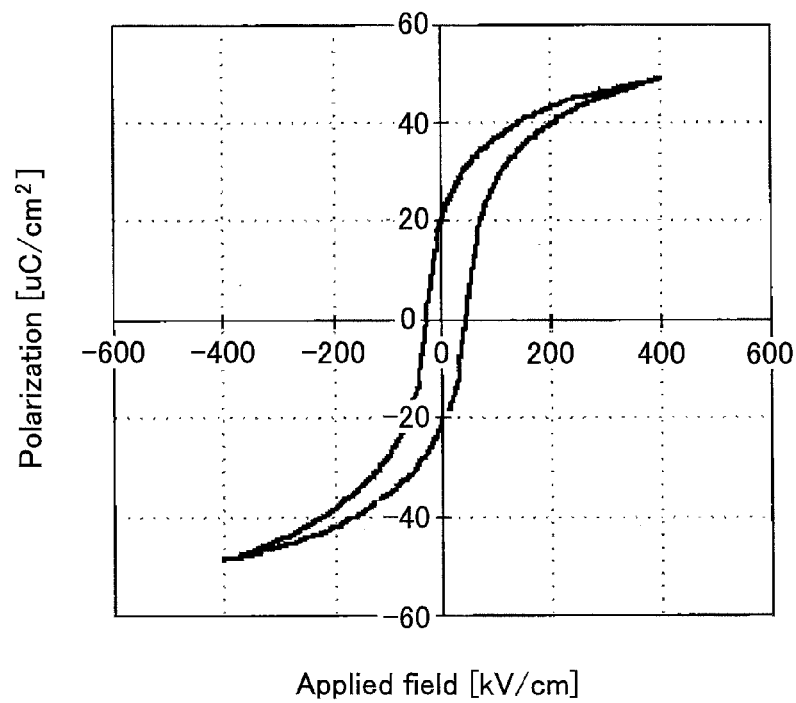
FIG. 9 is a characteristic diagram showing a typical hysteresis curve, which shows a relationship between an electric field strength and a polarization.

FIG. 9 is a characteristic diagram showing a typical hysteresis curve, which shows a relationship between an electric field strength and a polarization. The residual polarizations were obtained by the hysteresis curve. Further, deformation amounts of the corresponding electromechanical transducer elements 30 were measured by a laser Doppler vibrometer, and the piezoelectric constants d13 of the corresponding electromechanical transducer elements 30 were calculated by matching up the measured results with simulated results. Here, the deformations of the corresponding electromechanical transducer elements 30 were caused by applying electric fields (150 kV/cm) to the corresponding electromechanical transducer elements 30.

TABLE 1

| | Film compositions (at %) | | Variation amount at laminated interface | | Pr | | d13 | |
|---|---|---|---|---|---|---|---|---|
| | Pb (avg) | Zr (avg) | ΔPb | ΔZr | Initial state | After 1E10 | Initial state | After 1E10 |
| First embodiment | 106 | 53 | 4.0 | 10.9 | 24 | 23 | −155 | −152 |
| Second embodiment | 105 | 52 | 16.4 | 14.3 | 25 | 24 | −152 | −149 |
| Third embodiment | 105 | 53 | 3.0 | 18.0 | 27 | 26 | −158 | −156 |
| Fourth embodiment | 105 | 51 | 3.2 | 7.0 | 26 | 25 | −159 | −158 |
| Fifth embodiment | 109 | 68 | 4.6 | 12.0 | 27 | 26 | −142 | −140 |
| Sixth embodiment | 102 | 42 | 4.3 | 11.3 | 25 | 24 | −148 | −146 |
| Comparative example 1 | 98 | 52 | 20.2 | 11.4 | 24 | 18 | −129 | −101 |
| Comparative example 2 | 112 | 53 | 6.1 | 20.1 | 23 | 16 | −131 | −103 |
| Comparative example 3 | 105 | 53 | 25.2 | 10.1 | 24 | 17 | −145 | −118 |
| Comparative example 4 | 104 | 36 | 4.2 | 10.2 | 21 | 19 | −118 | −112 |
| Comparative example 5 | 106 | 75 | 3.8 | 11.5 | 19 | 17 | −110 | −105 |

In the first through sixth embodiments, the content of Pb in the compositions of the electromechanical transducer film 15 satisfied the condition such that Pb(avg) is greater than or equal to 100 at % and less than or equal to 110 at %, and ΔPb is less than or equal to 20%. In the first through sixth embodiments, as the initial characteristics of the corresponding electromechanical transducer films 15, values that were equivalent to the values for a normal ceramic sintered body (the residual polarization Pr is in a range from 20 uC/cm$^2$ to 30 uC/cm$^2$; the piezoelectric constant d13 is in a range from −160 μm/V to −140 μm/V) were obtained. Similarly, in the first through sixth embodiments, as the durability characteristics of the corresponding electromechanical transducer films 15, immediately after completion of 10$^{10}$ times of the applications of the voltages to the corresponding electromechanical transducer films 15, values that were equivalent to the values for the normal ceramic sintered body (the residual polarization Pr is in a range from 20 uC/cm$^2$ to 30 uC/cm$^2$; the piezoelectric constant d13 is in a range from −160 μm/V to −140 μm/V) were obtained. On the other hand, in the comparative examples 1 through 3, the content of Pb did not satisfy the above condition. The initial characteristics of the electromechanical transducer films 15 in the comparative examples 1 through 3 were equivalent to or slightly lower than that of the normal ceramic sintered body. However, as the durability characteristics of the electromechanical transducer films 15 in the comparative examples 1 through 3, both the residual polarization Pr and the piezoelectric constant d13 were degraded compared to those of the first through sixth embodiments. As described above, the electromechanical transducer films in the first through sixth embodiments were superior in the durability characteristic, compared to those of the comparative examples 1 though 3. This is because, in the first through sixth embodiments, Pb was prevented from escaping from the laminate interface by defining the condition on the content of Pb, and the content of Pb in the electromechanical transducer film 15 was substantially homogenized in the thickness direction.

Further, the comparative examples 4 and 5 indicated that, when the Zr(avg) in the electromechanical transducer film 15 was less than 40 at % or greater than 70 at %, the electromechanical transducing characteristic might not be sufficient in the initial condition, and the deformation amount of the electromechanical transducer film 15 might be small.

Hereinafter, the droplet discharge head 1 is explained. The droplet discharge head 1 includes the electromechanical transducer element 30 described above. For example, the droplet discharge head 1 exemplified in FIG. 1 can be produced by using the electromechanical transducer element 30 according to any of the first through sixth embodiments. The substrate 11 of the electromechanical transducer element 30 corresponds to the fluid channel forming substrate 4 that forms the compression chamber 9 in FIG. 1. Specifically, as shown in FIG. 1, the base substrate 5 that includes the oscillation plate and the lower electrode 6 (the first electrode 13, the second electrode 14) are laminated on the substrate 4. Then, the electromechanical transducer film 15 and the upper electrode 8, which are patterned, are formed on a predetermined portion of the lower electrode 6 by the above simple producing method. The electromechanical transducer film 15 is formed of the PZT, and has the same characteristic as that of the normal ceramic sintered body. After that, the fluid channel forming substrate 4 is produced by forming the fluid channel by applying the etching removal process from the rear surface (the bottom surface in FIG. 1) of the substrate 4, so as to form the compression chamber 9. Then, the nozzle plate 3 having the nozzle 2 is joined to the substrate 4, and thereby the droplet discharge head 1 shown in FIG. 1 is produced. Incidentally, in FIG. 1, descriptions of a liquid supply unit, the fluid channel, and a fluid resistance are omitted.

Figure 10:
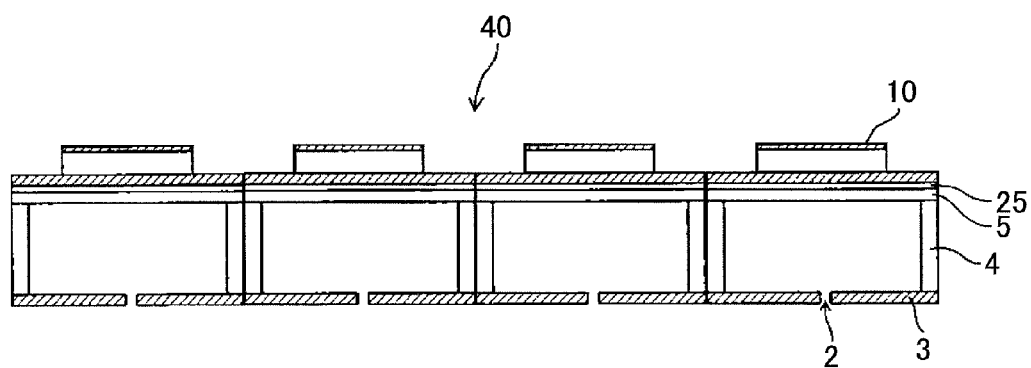
FIG. 10 is a cross-sectional view showing an example of a droplet discharge head for plural colors.

Further, a droplet discharge head 40 for plural colors as shown in FIG. 10 can be formed by arranging plural droplet discharge heads 1 shown in FIG. 1. In the droplet discharge head 40 in FIG. 10, an adhesive layer 25 is disposed between the base substrate 5 and the lower electrode 6. The adhesive layer 25 is for improving the adhesiveness between the lower electrode 6 and the base substrate 5. Here, the base substrate 5 is the oscillation plate. Incidentally, in FIG. 10, the descriptions of the liquid supply unit, the fluid channel, and the fluid resistance are omitted.

Next, the droplet discharge heads 40 shown in FIG. 10 were produced by using the corresponding electromechanical transducer elements formed in accordance with the first through sixth embodiments, and their droplet discharging characteristics were evaluated. An ink discharging status of each of the droplet discharge heads 40 was observed while using ink that was adjusted to have the viscosity of 5 cp and applying a voltage in a range from −30 V to −10V by using a simple push waveform. It was confirmed that in each of the droplet discharge heads 40, the ink was successfully discharged from all the nozzle holes. Further, it was confirmed that the droplet discharge heads 40 demonstrated stable ink-droplet discharging characteristics including durability.

Figure 11:
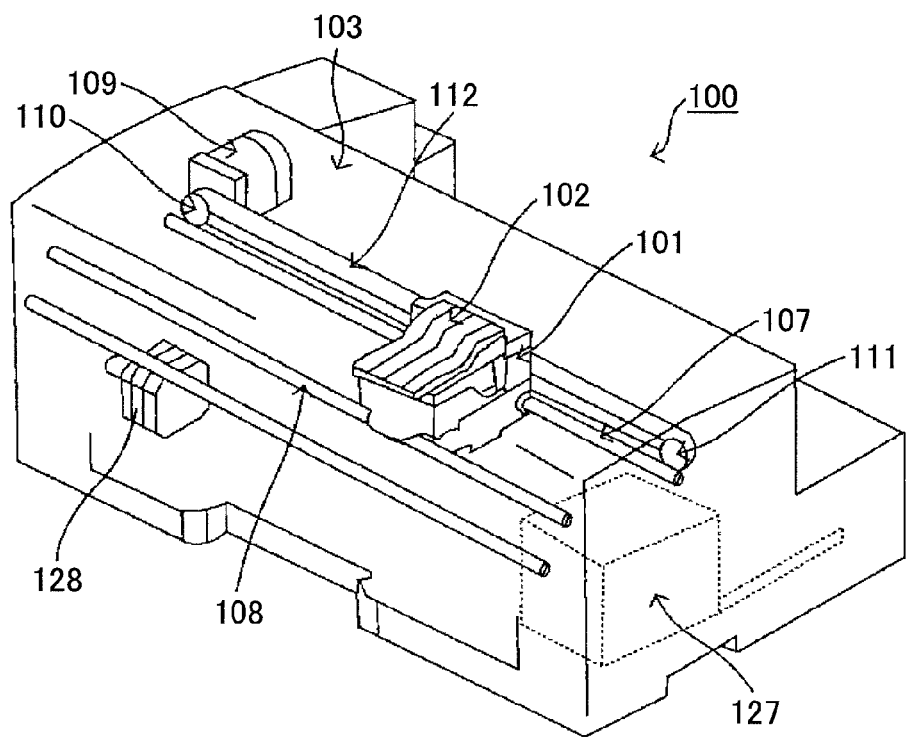
FIG. 11 is a perspective view exemplifying an inkjet recording device.
Figure 12:
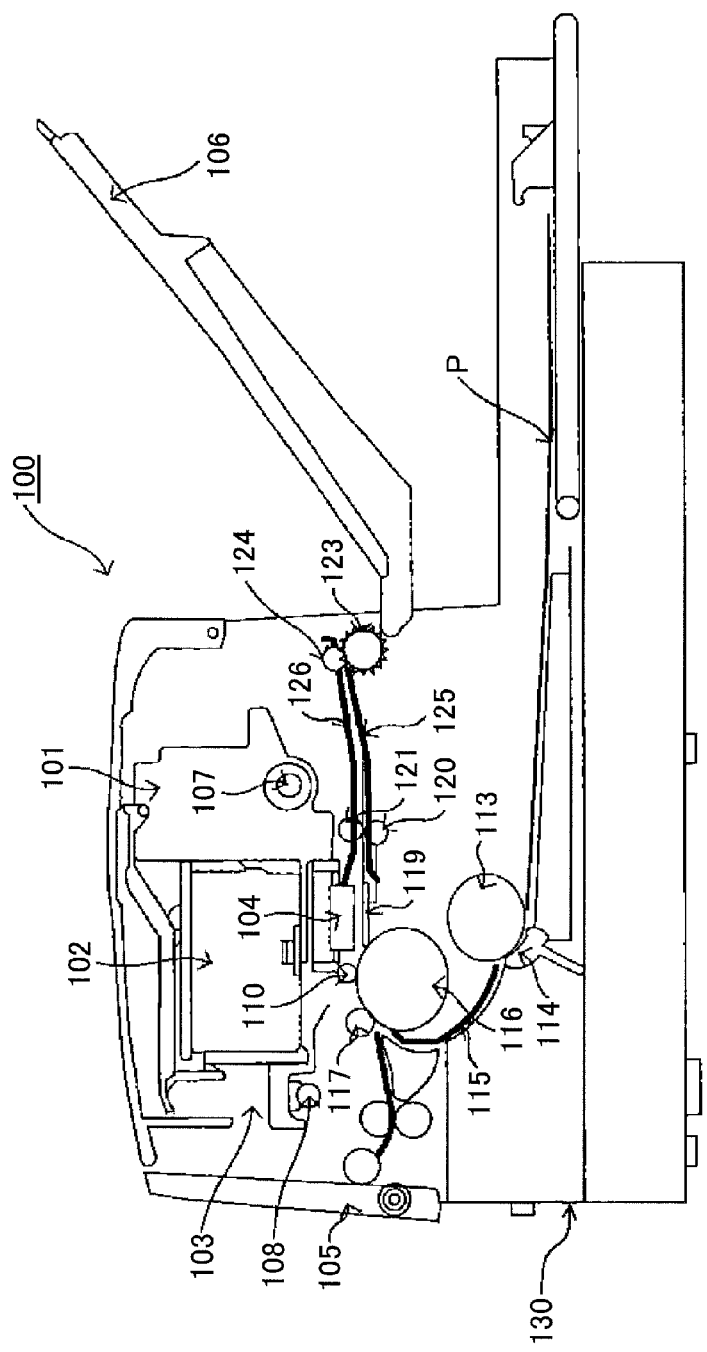
FIG. 12 is a side view exemplifying the inkjet recording device.

Next, an example of the inkjet recording device is explained by referring to FIGS. 11 and 12. The inkjet recording device includes the droplet discharge head 40 of FIG. 10. Here, FIG. 11 is a perspective view exemplifying the inkjet recording device, and FIG. 12 is a side view exemplifying the inkjet recording device. Incidentally, the inkjet recording device is a representative example of the droplet discharging device according to the embodiment.

The inkjet recording device 100 shown in FIGS. 11 and 12 is the example of the droplet discharging device. The inkjet recording device 100 includes a print unit 103 disposed inside the inkjet recording device 100. The print unit 103 mainly includes a carriage 101 that can be moved in a main scanning direction; a recording head 104 mounted on the carriage 101; and an ink cartridge 102 for supplying ink to the recording head 104. The recording head 40 is an example of the droplet discharge head described above.

A paper feed cassette 130 can be detachably attached to a lower part of the main body of the inkjet recording device 100. Many sheets of recording paper P can be stored in the paper feed cassette 130. In addition, the inkjet recording device 100 includes an openable and closeable manual feed tray 105 for manually feeding sheets of recording paper P. The inkjet recording device 100 takes in the sheet of recording paper P fed from the paper feed cassette 130 or the manual feed tray 105. Then, after a desired image has been printed onto the sheet of recording paper P by the print unit 103, the inkjet recording device 100 discharges the sheet of recording paper P onto a paper discharge tray 106 attached to a rear surface side of the inkjet recording device 100.

In the print unit 103, the carriage 101 is supported by a main guide rod 107 and a sub guide rod 108, so that the carriage 101 can be slid in the main scanning direction. The main guide rod 107 and the sub guide rod 108 are horizontally supported by left and right side plates (not shown). The recording head 104 is attached to the carriage 101. Here, the recording head 104 includes inkjet heads, which are examples of the droplet discharge head 40. The inkjet heads discharge yellow (Y) ink droplets, cyan (C) ink droplets, magenta (M) ink droplets, and black (Bk) ink droplets, respectively. Plural ink discharge ports (nozzles) of the recording head 104 are arranged in a direction intersecting the main scanning direction. The recording head 104 is attached to the carriage 101 so that the ink discharging direction is directed downward.

Ink cartridges 102 corresponding to yellow, cyan, magenta, and black, respectively, are exchangeably attached to the carriage 101. The ink cartridges 102 are for supplying the yellow ink, the cyan ink, the magenta ink, and the black ink, respectively, to the recording head 104. Each of the ink cartridges 102 includes an air inlet that communicates with the outside air; a supply port for supplying the corresponding ink to the recording head 104; and a porous body filled with the corresponding ink. Here, the air inlet is arranged at an upper portion of the ink cartridge 102, the supply port is arranged at a lower portion of the ink cartridge 102, and the porous body is disposed inside the ink cartridge 102. The pressure of the ink supplied to the recording head 104 is kept slightly negative by the capillary force of the porous body. Here, as the recording head 104, the droplet discharge head 40 of FIG. 10 including the heads corresponding to yellow, cyan, magenta, and black are utilized. However, the recording head may be the droplet discharge head of FIG. 1 having nozzles for discharging yellow (Y) ink droplets, cyan (C) ink droplets, magenta (M) ink droplets, and a black (Bk) ink droplets.

A rear side of the carriage 101 (downstream side in a recording paper conveyance direction) is slidably fitted into the main guide rod 107, and a front side of the carriage 101 (upstream side in the recording paper conveyance direction) is slidably placed on the sub guide rod 108. A timing belt 112 is wound around a drive pully 110 and a driven pully 111. The drive pully 110 is rotationally driven by a main scanning motor 109. The timing belt 112 is fixed to the carriage 101, so that the carriage 101 can be moved and can scan in the main scanning direction. The carriage 101 can be reciprocated in the main scanning direction by the forward and reverse rotations of the main scanning motor 109.

On the other hand, the inkjet recording device 100 includes a paper feeding roller 113 and a friction pad 114 for feeding the recording papers P from the paper feed cassette 130 and for separating the recording papers P; a guide member 115 for guiding the recording paper P; a conveyance roller 116 that inverts the recording paper P being fed and conveys the recording paper P; a pressing roller 117 that is pressed to a peripheral surface of the conveyance roller 116; and a top end roller 110 that defines an angle of sending the recording paper P from the conveyance roller 116, so as to convey the recording paper P being set in the paper feed cassette 130 to a lower side of the recording head 104. The conveyance roller 116 is rotationally driven by a sub-scanning motor 128 through a sequence of gears. Further, a print support member 119 for guiding the recording paper P sent out from the conveyance roller 116 at the portion below the recording head 104 is provided. The length of the print support member 119 corresponds to a moving range in the main scanning direction of the carriage 101. At the downstream side in the recording paper conveyance direction of the printing support member 119, the inkjet recording device 100 further includes a conveyance roller 120 and a spur 123 that are rotationally driven so as to send the recording paper P in a paper discharging direction; a paper eject roller 121 and a spur 124 for sending the recording paper P onto the paper discharge tray 106; and guide members 125 and 126 that form a paper ejection path.

When the inkjet recording device 100 prints an image, the inkjet recording device 100 drives the recording head 104, while moving the carriage 101. In this manner, the recording head 104 discharges ink toward the recording paper P, which remains stationary, and printing corresponding to one line is completed. Subsequently, the inkjet recording device 100 prints the next line, after moving the recording paper P by a predetermined distance. When the inkjet recording device 100 receives a printing termination signal or a signal indicating that the end of the recording paper P has reached the printing area, the inkjet recording device 100 terminates the printing operation and ejects the recording paper P.

Further, the inkjet recording device 100 includes a recovering device 127 for recovering a discharge failure of the recording head 104. The recovering device 127 is disposed at a position outside the printing area. Here, the position is at a rightmost side in a direction in which the carriage 101 moves. The recovering device 127 includes a cap unit, a suction unit, and a cleaning unit. During the print waiting state, the carriage 101 is moved to the side of the recovering device 127, and the recording head 104 is capped by the cap unit. In this manner, the wet conditions of the discharging ports are maintained, and a discharge failure caused by ink drying is prevented. Additionally, during printing, the inkjet recording device 100 causes the recording head 104 to discharge ink that are not related to the recording. In this manner ink viscosities at all the discharging ports are kept constant, and a stable discharging performance is maintained.

When a discharge failure occurs, the inkjet recording device 100 causes the cap unit to seal the discharging ports (nozzles) of the recording head 104. Then, the suction unit suctions babbles along with the ink from the discharging ports through a tube. The cleaning unit removes the inks or dusts attached to a surface of the discharging ports. In this manner, the discharge failure is recovered. The suctioned ink is discharged to a waste ink reservoir (not shown) disposed at a lower portion of the main body of the inkjet recording device 100, and an ink absorber in the waste ink reservoir absorbs and reserves the suctioned ink.

As described above, since the inkjet recording device 100 includes the recording head 104 including the electromechanical transducer element 30 according to any of the first through sixth embodiments, an ink discharging failure caused by a failure for driving the oscillation plate 12 is prevented. Therefore, a stable ink discharging characteristic is obtained and the quality of the image is improved.

According to the embodiments, an electromechanical transducer element can be obtained. The electromechanical transducer element includes the lower electrode (the first electrode 13 and the second electrode 14); the electromechanical transducer film 15 disposed on the lower electrode and formed of the complex oxide (PZT) including lead (Pb), titanium (Ti), and zirconium (Zr); and the upper electrode (the third electrode 16) formed on the electromechanical transducer film 15. The electromechanical transducer film 15 is formed by the chemical solution deposition method. Namely, the electromechanical transducer film 15 having a predetermined thickness is formed by laminating the plural PZT thin films by repeatedly applying the precursor film forming process for forming the film of the PZT precursor and the baking process for crystallizing the film. When the atomic weight ratio (Pb/(Zr+Ti)) of the average Pb included in the electromechanical transducer film 15 having the predetermined thickness is denoted by Pb(avg) and the atomic weight ratio (Pb/(Zr+Ti)) of the Pb in any one of the laminate interfaces of the plural thin films forming the electromechanical transducer film 15 is denoted by Pb(interface), Pb(avg) is adjusted to be greater than or equal to 100 at % and less than or equal to 110 at %, and the fluctuation ratio of the Pb in the laminate interface, namely ΔPb=Pb(avg)−Pb(interface), is adjusted to be less than or equal to 20%. In this manner, in the electromechanical transducer film 15, the content of Pb is substantially homogenized in the thickness direction and regulated to be within a predetermined range. Therefore, similar to the cases of the above experiments, the variation the electromechanical transducing characteristic from that of the initial state is regulated to be within a small range, during a continuous operation. Further, according to the embodiments, when the atomic weight ratio (Zr/(Zr+Ti)) of the average Zr included in the electromechanical transducer film 15 having the predetermined thickness is denoted by Zr(avg) and the atomic weight ratio (Zr/(Zr+Ti)) of the Zr in any one of the laminate interfaces of the plural thin films forming the electromechanical transducer film 15 is denoted by Zr(interface), the fluctuation ratio of the Zr in the laminate interface, namely ΔZr=Zr(interface)−Zr(avg), is adjusted to be less than or equal to 20%. As in the cases of the above experiments, when the fluctuation ratio of the Zr in the laminate interface is less than or equal to 20%, excellent electromechanical transducing characteristics are obtained, as the initial characteristic and as the durability characteristic. Further, according to the embodiments, Zr(avg) is adjusted to be greater than or equal to 40 at % and less than or equal to 70 at %. As in the cases of the above experiments, when the Zr(avg) is greater than or equal to 40 at % and less than or equal to 70 at %, excellent electromechanical transducing characteristics are obtained, both as the initial characteristic and as the durability characteristic. On the other hand, when the Zr(avg) is less than 40 at % or greater than 70 at %, the electromechanical transducing characteristic at the initial state may on not be sufficient, and the deformation amount may be small. Further, according to the embodiments, for the crystalline orientation of the electromechanical transducer film 15, when the Lotgering method is utilized, the degree of orientation in the plane direction (111) is adjusted to be greater than or equal to 0.85 and the degree of orientation in the plane direction (110) is adjusted to be less than or equal to 0.10. When the degree of orientation in the plane direction (111) is less than 0.85 or the degree of orientation in the plane direction (110) is greater than 0.10, the degradation amount of the deformation after a continuous operation becomes large. Further, according to the embodiments, the thickness of the PZT thin film formed per one baking process is regulated to be greater than or equal to 200 nm and less than or equal to 300 nm. When the thickness of the thin film is less than 200 nm, the number of times of applying the baking process for forming the electromechanical transducer film 15 having the predetermined thickness is increased. Therefore, the effect of compositional variations of the elements in the laminate interface portion becomes large, and a sufficient electromechanical transducing characteristic may not be obtained. On the other hand, when the thickness of the thin film is greater than 300 nm, cracks tend to occur in the electromechanical transducer film 15, due to the volumetric change caused by crystallization in the baking process. Further, according to the embodiments, the electromechanical transducer film 15 having an excellent characteristic can be easily obtained by forming the electromechanical transducer film 15 by the sol-gel method. Further, according to the embodiments, the droplet discharge head 1 includes the nozzle 2 for discharging droplets, the compression chamber 9 that communicates with the nozzle 2, and the discharge driving unit for increasing the pressure of the liquid inside the compression chamber 9. Here, as the discharge driving unit, the base substrate 5 is formed of the oscillation plate. Here, the base substrate 5 is a part of walls of the compression chamber 9. The electromechanical transducer element 10 is disposed on the oscillation plate. With such a configuration, the fluctuation of the droplet discharging characteristic is regulated to be within a small range, even during a continuous operation, and a stable ink discharging characteristic is obtained. Further, according to the embodiments, by using the droplet discharging device including the droplet discharge head, stable image quality can be obtained, even during a continuous operation.

The electromechanical transducer element, the droplet discharge head, and the droplet discharge device have been explained by the embodiments. However, the present invention is not limited to the specifically disclosed embodiments, and variations and modifications may be made without departing from the scope of the present invention.

The present application is based on Japanese priority application No. 2011-145554 filed on Jun. 30, 2011, the entire contents of which are hereby incorporated herein by reference.

What is claimed is:

1. An electromechanical transducer element that includes an electromechanical transducer film formed of a complex oxide (PZT) including lead (Pb), zirconium (Zr), and titanium (Ti),
   wherein the electromechanical transducer film is produced by depositing a chemical solution,
   wherein the electromechanical transducer film is formed by laminating plural PZT thin films and crystallizing each PZT precursor film until a thickness of the formed electromechanical transducer film becomes a predetermined thickness,
   wherein, when an atomic weight ratio (Pb/(Zr+Ti)) of average Pb included in the formed electromechanical transducer film having the predetermined thickness is denoted by Pb(avg) and an atomic weight ratio (Pb/(Zr+Ti)) of Pb in any first one of laminate interfaces of the plural PZT thin films included in the formed electromechanical transducer film is denoted by Pb(interface), the Pb(avg) is greater than or equal to 100 atomic percentage (at %) and less than or equal to 110 atomic percentage (at %), and a fluctuation ratio ΔPb=Pb(avg)−Pb(interface) of Pb in the first one of the laminate interfaces is less than or equal to 20 percent.

2. The electromechanical transducer element according to claim 1,
   wherein, when an atomic weight (Zr/(Zr+Ti)) of average Zr included in the formed electromechanical transducer film having the predetermined thickness is denoted by Zr(avg) and an atomic weight (Zr/(Zr+Ti)) of Zr in any second one of the laminate interfaces of the plural PZT thin films included in the formed electromechanical transducer film is denoted by Zr(interface), a fluctuation ratio ΔZr=Zr(interface)−Zr(avg) of Zr in the second one of the laminated interfaces is less than or equal to 20 percent.

3. The electromechanical transducer element according to claim 1,
   wherein, for a crystalline orientation of the formed electromechanical transducer film, a first degree of a first orientation in a plane direction (111) calculated by a Lotgering method is greater than or equal to 0.85 and a second degree of a second orientation in a plane direction (110) calculated by the Lotgering method is less than or equal to 0.10,
   wherein, when a sum of all peaks of orientations obtained by an X-ray diffraction is set to be 1, a degree of an orientation calculated by the Lotgering method indicates an orientation ratio of the orientation, and
   wherein the degree of the orientation calculated by the Lotgering method is an average degree of the orientation calculated by a formula $\rho=\Sigma I(00l)/\Sigma I(hkl)$, wherein a denominator is a sum of all peak intensities, and a numerator is a peak intensity of an arbitrary orientation.

4. The electromechanical transducer element according to claim 1,
   wherein a thickness of the PZT thin film formed per one time of the baking process is greater than or equal to 200 nm and less than or equal to 300 nm.

5. The electromechanical transducer element according to claim 1,
   wherein the electromechanical transducer film is produced by a sol-gel method.

6. The electromechanical transducer element according to claim 2,
   wherein the Zr(avg) is greater than or equal to 40 atomic percentage (at %) and less than or equal to 70 atomic percentage (at %).

7. A droplet discharge head comprising:
   a nozzle configured to discharge droplets;
   a compression chamber configured to communicate with the nozzle; and
   a discharge driving unit configured to increase pressure of a liquid inside the compression chamber,
   wherein, as the discharge driving unit, a portion of walls of the compression chamber is formed of an oscillation plate, and an electromechanical transducer element is attached to the oscillation plate,
   wherein the electromechanical transducer element includes an electromechanical transducer film formed of a complex oxide (PZT) including lead (Pb), zirconium (Zr), and titanium (Ti),
   wherein the electromechanical transducer film is produced by depositing a chemical solution,
   wherein the electromechanical transducer film is formed by laminating plural PZT thin films and crystallizing each PZT precursor film until a thickness of the formed electromechanical transducer film becomes a predetermined thickness,
   wherein, when an atomic weight ratio (Pb/(Zr+Ti)) of average Pb included in the formed electromechanical transducer film having the predetermined thickness is denoted by Pb(avg) and an atomic weight ratio (Pb/(Zr+Ti)) of Pb in any one of laminate interfaces of the plural PZT thin films included in the formed electromechanical transducer film is denoted by Pb(interface), the Pb(avg) is greater than or equal to 100 atomic percentage (at %) and less than or equal to 110 atomic percentage (at %), and a fluctuation ratio ΔPb=Pb(avg)−Pb(interface) of Pb in the one of the laminate interfaces is less than or equal to 20 percent.

8. A droplet discharge device that includes a droplet discharge head,
   wherein the droplet discharge head includes:
   a nozzle configured to discharge droplets;
   a compression chamber configured to communicate with the nozzle; and
   a discharge driving unit configured to increase pressure of a liquid inside the compression chamber,
   wherein, as the discharge driving unit, a portion of walls of the compression chamber is formed of an oscillation plate, and an electromechanical transducer element is attached to the oscillation plate,
   wherein the electromechanical transducer element utilizes an electromechanical transducer film formed of a complex oxide (PZT) including lead (Pb), zirconium (Zr), and titanium (Ti),
   wherein the electromechanical transducer film is produced by depositing a chemical solution,
   wherein the electromechanical transducer film is formed by laminating plural PZT thin films and crystallizing each PZT precursor film until a thickness of the formed electromechanical transducer film becomes a predetermined thickness,
   wherein, when an atomic weight ratio (Pb/(Zr+Ti)) of average Pb included in the formed electromechanical transducer film having the predetermined thickness is denoted by Pb(avg) and an atomic weight ratio (Pb/(Zr+Ti)) of Pb in any one of laminate interfaces of the plural PZT thin films included in the formed electromechanical transducer film is denoted by Pb(interface), the Pb(avg) is greater than or equal to 100 atomic percentage (at %) and less than or equal to 110 atomic percentage (at %), and a fluctuation ratio ΔPb=Pb(avg)−Pb(interface) of Pb in the one of the laminate interfaces is less than or equal to 20 percent.

9. An image forming device comprising:
   a droplet discharge head,
   wherein the droplet discharge head includes:
   a nozzle configured to discharge droplets;
   a compression chamber configured to communicate with the nozzle; and
   a discharge driving unit configured to increase pressure of a liquid inside the compression chamber,
   wherein, as the discharge driving unit, a portion of walls of the compression chamber is formed of an oscillation plate, and an electromechanical transducer element is attached to the oscillation plate,
   wherein the electromechanical transducer element includes an electromechanical transducer film formed of a complex oxide (PZT) including lead (Pb), zirconium (Zr), and titanium (Ti), wherein the electromechanical transducer film is produced by depositing a chemical solution, wherein the electromechanical transducer film is formed by laminating plural PZT thin films and crystallizing each PZT precursor film until a thickness of the formed electromechanical transducer film becomes a predetermined thickness, wherein, when an atomic weight ratio (Pb/(Zr+Ti)) of average Pb included in the formed electromechanical transducer film having the predetermined thickness is denoted by Pb(avg) and an atomic weight ratio (Pb/(Zr+Ti)) of Pb in any one of laminate interfaces of the plural PZT thin films included in the formed electromechanical transducer film is denoted by Pb(interface), the Pb(avg) is greater than or equal to 100 atomic percentage (at %) and less than or equal to 110 atomic percentage (at %), and a fluctuation ratio $\Delta Pb = Pb(avg) - Pb(interface)$ of Pb in the one of the laminate interfaces is less than or equal to 20 percent.

* * * * *